(12) United States Patent
Miyaji

(10) Patent No.: US 8,022,594 B2
(45) Date of Patent: Sep. 20, 2011

(54) SURFACE ACOUSTIC WAVE DEVICE

(75) Inventor: Naomi Miyaji, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 944 days.

(21) Appl. No.: 11/822,916

(22) Filed: Jul. 11, 2007

(65) Prior Publication Data

US 2008/0018415 A1     Jan. 24, 2008

(30) Foreign Application Priority Data

Jul. 21, 2006   (JP) ................................. 2006-199321

(51) Int. Cl.
*H01L 41/08* (2006.01)
(52) U.S. Cl. .................................... 310/313 B; 310/348
(58) Field of Classification Search .............. 310/313 R, 310/313 B, 344, 340, 348; 333/133, 193; H01L 41/08; H03H 3/08
See application file for complete search history.

(56) References Cited

U.S. PATENT DOCUMENTS

| | | | |
|---|---|---|---|
| 6,078,123 A | | 6/2000 | Tanaka et al. |
| 6,388,545 B1 * | | 5/2002 | Kawachi et al. .......... 310/313 B |
| 6,734,601 B2 * | | 5/2004 | Taga ......................... 310/313 R |
| 6,852,561 B2 * | | 2/2005 | Bidard et al. .................... 438/50 |
| 7,176,599 B2 * | | 2/2007 | Kawachi et al. .......... 310/313 R |
| 2006/0131998 A1 * | | 6/2006 | Aoki et al. ..................... 310/340 |

FOREIGN PATENT DOCUMENTS

| | | |
|---|---|---|
| JP | 58-197909 A | 11/1983 |
| JP | 06-204293 A | 7/1994 |
| JP | 11-067830 A | 3/1999 |
| JP | 2001-094387 A | 4/2001 |
| JP | 2001-094388 A | 4/2001 |

* cited by examiner

*Primary Examiner* — Walter Benson
*Assistant Examiner* — Karen B Addison
(74) *Attorney, Agent, or Firm* — Chen Yoshimura LLP

(57) ABSTRACT

To provide a manufacturing method for a surface acoustic wave device, which makes it possible to easily and reliably connect a piezoelectric element to a substrate having an external connection terminal, and a surface acoustic wave device capable of being made smaller using this manufacturing method. A surface acoustic wave device, having a first substrate which has a interdigital transducer and an electrode pad on one side; and a second substrate which has an external terminal, and a castellation formed on the side connected to the external terminal, wherein the surface of the second substrate opposite the surface on which the external terminal is formed is bonded by a bonding layer to the electrode pad, the first substrate is larger in size than the second substrate, and a part of the electrode pad, which extends outwardly of the second substrate, is connected to the castellation by a plating layer.

4 Claims, 3 Drawing Sheets

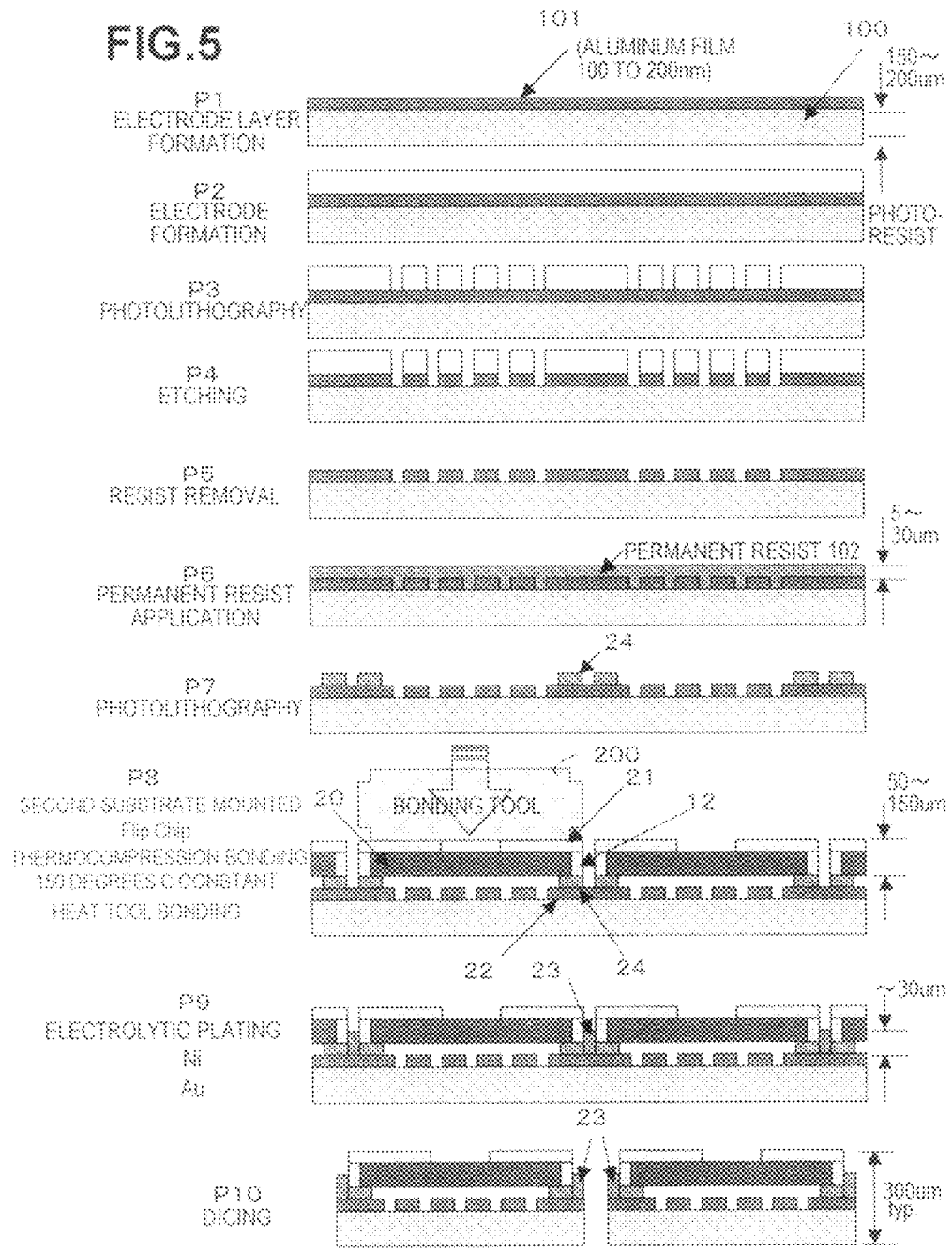

SURFACE ACOUSTIC WAVE DEVICE

CROSS-REFERENCE TO RELATED APPLICATIONS

This application is based upon and claims the benefit of priority from the prior Japanese Patent Application No. 2006-199321, filed on Jul. 21, 2006, the entire contents of which are incorporated herein by reference.

BACKGROUND OF THE INVENTION

1. Field of the invention

The present invention relates to a surface acoustic wave device, and a manufacturing method therefor.

2. Description of the Related Art

A surface acoustic wave device has a surface acoustic wave element in which a interdigital transducer is formed on the surface of a piezoelectric element, and achieves electrical characteristics as an resonance circuit or a filter by the propagation of surface acoustic waves between the interdigital transducer.

Therefore, when a surface acoustic wave element is enclosed inside a surface acoustic wave device, space is required at least on the surface on which the interdigital transducer of the piezoelectric element is formed. Furthermore, since the propagation characteristics of a surface acoustic wave change when dust or moisture adheres to the interdigital transducer, it is desirable to hermetically seal the space on the surface where a interdigital transducer is formed.

One conventional method for satisfying such a requirement, for example, is a constitution in which the connection between the package and the piezoelectric element is connected by a bump, a stacked part serves as a wall, and, in addition, a lid is soldered on, as shown in Japanese Patent Laid-open No. H6-204293.

FIG. 1 is a diagram, which further illustrates a cross-sectional structure of such a conventional surface acoustic wave device.

The conventional surface acoustic wave device has a package substrate 1, which has a metallization pattern 10, and a piezoelectric element 3, which has a interdigital transducer 30 and pads 31, and the pads 31 of the piezoelectric element 3 are connected to the metallization pattern 10 of the package substrate 1 via bumps 2.

A hollow space for the interdigital transducer 30 is secured by the height of the bumps 2. Furthermore, electrical connections to the external connection terminals 11 of the package substrate 1 are formed by castellations 12.

Further, a package stacked part 4 is provided on the periphery of the package substrate 1 so as to surround the piezoelectric element 3, and a lid 5, which covers the piezoelectric element 3, is sealed by solder 13 to the upper part of the package stacked part 4.

SUMMARY OF THE INVENTION

Looking at the conventional constitution shown in the above-mentioned FIG. 1, a package 1, a package stacked part 4, and a lid 5 are required, and as such, the conventional constitution is disadvantageous from the standpoint of making a surface acoustic wave device smaller. Another problem is that the difference in the coefficient of linear expansion between the piezoelectric element 3 and the package 1 when using bumps to connect the piezoelectric element 3 by heating them at a high temperature gives rise to thermal stress, causing poor connections.

Therefore, with the foregoing in view, an object of the present invention is to provide a manufacturing method for a surface acoustic wave device, which makes it possible to easily and reliably connect a piezoelectric element to a substrate having an external connection terminal, and a surface acoustic wave device capable of being made smaller using this manufacturing method.

A first aspect of the present invention, which solves for the above-mentioned problems, is a surface acoustic wave device, having a first substrate, which has a interdigital transducer and an electrode pad 22 on one side; and a second substrate which has an external terminal, and a castellation formed on the side connected to the external terminal, wherein the surface of the second substrate opposite the surface on which the external terminal is formed is bonded by a bonding layer to the electrode pad 22 of the first substrate, the first substrate is larger in size than the second substrate, and a part of the electrode pad 22 of the first substrate, which extends outwardly of the second substrate, is connected to the castellation by a plating layer 23.

In the above-mentioned first aspect, the plating layer 23 is grown by an electrolytic plating method subsequent to mounting the second substrate to the first substrate, and electrically connects the part of the electrode pad 22 of the first substrate, which extends outwardly of the second substrate, to the castellation.

Further, in the above-mentioned first aspect, the bonding layer is also a photosensitive material formed by an exposure and development method.

Furthermore, in the above-mentioned first aspect, the bonding layer is also a thermosetting material, which bonds the second substrate using a thermosetting method.

A second aspect of the present invention, which solves for the above-mentioned problems, is a manufacturing method for a surface acoustic wave device, having the steps of forming a bonding layer on a first substrate, on one side of which is formed a interdigital transducer and an electrode pad 22, in a location corresponding to the electrode pad 22; mounting a second substrate which is smaller in size than the first substrate and which comprises an external terminal, and a castellation formed on the side connected to the external terminal; bonding the second substrate to the first substrate by the bonding layer by pressing the second substrate against the first substrate at a fixed heating temperature; and connecting the electrode pad 22 of the first substrate, which extends outwardly of the second substrate, to the castellation of the second substrate by a plating layer 23.

Further, a third aspect of the present invention, which solves for the above-mentioned problems, is a manufacturing method for a surface acoustic wave device, having the steps of forming a interdigital transducer and an electrode pad 22 corresponding to respective areas of a plurality of surface acoustic wave elements, which are formed on a single piezoelectric substrate of a prescribed size; forming a bonding layer in a location corresponding to the electrode pad 22; mounting a second substrate which is smaller in size than the area of one surface acoustic wave element and which comprises an external terminal, and a castellation formed on the side connected to the external terminal, to each of the areas of the plurality of surface acoustic wave elements; bonding the second substrate to the first substrate by the bonding layer by pressing the second substrate against the first substrate at a fixed heating temperature; connecting the electrode pad 22 of the first substrate, which extends outwardly of the second substrate, to the castellation of the second substrate by a plating layer 23; and subsequently obtaining individual surface acoustic wave devices by using dicing to cut and separate the areas of the plurality of surface acoustic wave elements.

As explained in accordance with the above-mentioned features, the present invention makes it possible to realize a low-profile, compact surface acoustic wave device with high bonding reliability by utilizing an electrode structure, in which the bumps formed on the electrode pads of the piezoelectric element are not required, and the second substrate has the functions of a lid and package.

BRIEF DESCRIPTION OF THE DRAWINGS

FIG. 5 A process drawing illustrating the manufacture of a surface acoustic wave device according to the present invention.

DESCRIPTION OF THE PREFERRED EMBODIMENTS

An embodiment of the present invention will be explained below by referring to the figures.

The structure of an embodiment of a surface acoustic wave device according to the present invention will be explained using FIGS. 2 and 3.

Figure 1:
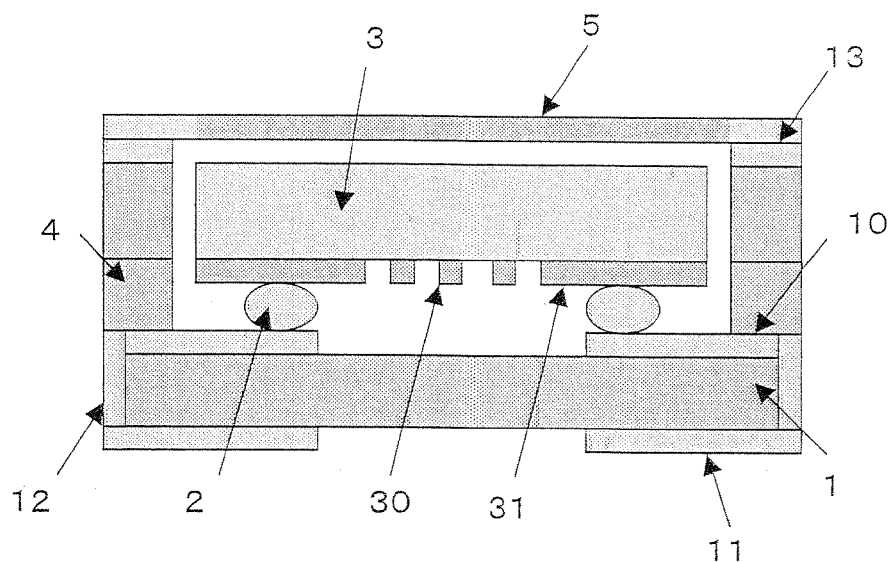
FIG. 1 A diagram, which illustrates the cross-sectional structure of a conventional surface acoustic wave device.
Figure 2:
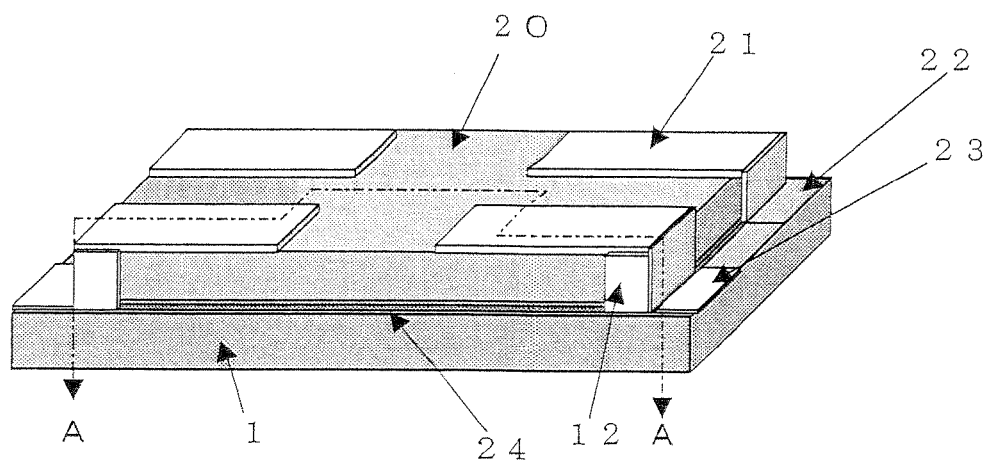
FIG. 2 An external view of the structure of an embodiment of a surface acoustic wave device according to the present invention.
Figure 3:
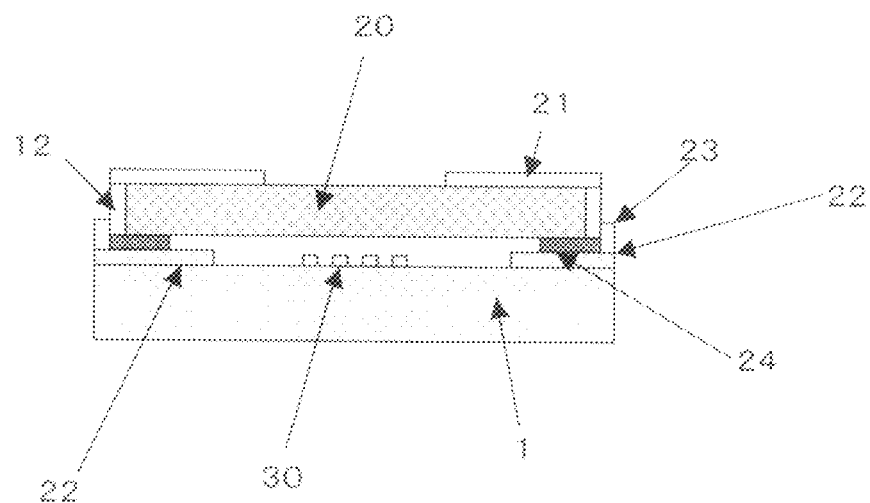
FIG. 3 A cross-sectional view along line A-A of FIG. 2.

FIG. 2 is an external view of the structure of an embodiment of a surface acoustic wave device, and FIG. 3 is a cross-sectional view along line A-A of FIG. 2.

Figure 4:
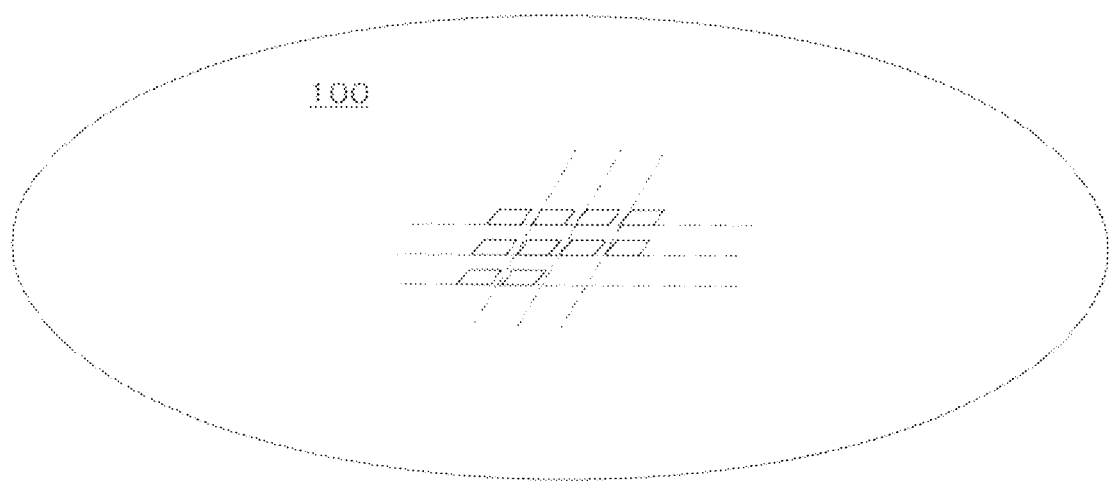
FIG. 4 A diagram illustrating a plurality of surface acoustic wave devices formed on a wafer.

The individual surface acoustic wave device shown in FIG. 2 is one of a plurality of surface acoustic wave devices formed on a wafer as shown in FIG. 4. The surface acoustic wave device shown in FIG. 2 has been cut out and separated from the plurality of surface acoustic wave devices on this wafer using dicing.

FIG. 5 is a process drawing illustrating the manufacture of a surface acoustic wave device according to the present invention.

The features of the structure shown in FIGS. 2 and 3 will be explained while referring to the process drawing of FIG. 5.

In FIG. 5, a wafer 100 comprising a 150 to 200 micrometer (μm) piezoelectric substrate is first prepared. A 100 to 200 nanometer (nm) thick aluminum (Al) electrode film 101 is formed over the entire surface of this wafer (Processing Step P1).

A photoresist is applied on top of the Al electrode film 101 (Processing Step P2), photolithography is used to pattern the electrodes of a surface acoustic wave element (Processing Step P3), and etching is performed, leaving behind the masked areas (Processing Step P4). Next, the photoresist is removed (Processing Step P5).

Furthermore, to form a bonding layer 24, a fine adhesive agent having photosensitivity and thermosetting characteristics is applied to ensure thickness, and a 5 to 30 μm permanent resist layer 102 is formed (Processing Step P6).

Next, this permanent resist 102 is patterned using photolithography, and removed using etching to leave behind the bonding layer 24 area (Processing Step P7).

A second substrate is mounted on top of the first substrate 1 formed in this way.

Here, the second substrate 20 has an external terminal 21 formed on one surface, and has a castellation 12 connected to the external terminal 21 on the side. This second substrate 20 is pressed against the first substrate 1 using a bonding tool 200, which furnishes a fixed temperature of 150 degrees C., and the pads 22 of the first substrate 1 are connected to the castellations 12 of the second substrate 20 by thermocompression bonding using the bonding layer 24 (Processing Step P8).

Next, around a 30 μm nickel (Ni) and gold (Au) alloy electrolytic plating metallization layer 23 is formed on the part of the electrode pad 22, which extends from the first substrate 1 to a location near the castellation 12 (Processing Step P9). The metal is deposited and grown by passing an electric-current through the electrode pad 22 and electrolytic plating metallization layer 23. Consequently, the grown plating reaches the castellation 12 of the second substrate 20, electrically connecting the electrode pad 22 of the first substrate 1 to the second substrate 20.

Next, dicing is used to cut the first substrate 1 into individual surface acoustic wave device units. The first substrate is slightly larger than the second substrate 20 at this time.

It can readily be understood that, according to the present invention, it is possible to realize a low-profile, compact surface acoustic wave device with high bonding reliability as explained hereinabove.

What is claimed is:

1. A surface acoustic wave device, comprising:
a first substrate, having an interdigital transducer and an electrode pad on a first surface of said first substrate; and
a second substrate, having an external terminal and a castellation formed on a side surface of the second substrate and connected to said external terminal,
wherein a second surface of said second substrate, opposite a third surface on which said external terminal is formed, is bonded by a bonding layer to said electrode pad of said first substrate,
said first surface of said first substrate on which said interdigital transducer is formed is larger than said second surface facing said first surface, and a part of said electrode pad of said first substrate is connected to said castellation by a plating layer; and
said part of said electrode pad that is connected to said castellation extends on said first surface and outside said second substrate.

2. The surface acoustic wave device according to claim 1, wherein said plating layer is grown by an electrolytic plating method subsequent to mounting said second substrate on said first substrate, and electrically connects the part of said electrode pad of said first substrate, which extends outwardly of said second substrate, to said castellation.

3. The surface acoustic wave device according to claim 1, wherein said bonding layer is a photosensitive material formed by an exposure and development method.

4. The surface acoustic wave device according to claim 3, wherein said bonding layer is also a thermosetting material, which bonds said second substrate using a thermosetting method.

* * * * *